(12) United States Patent
Wunderlich et al.

(10) Patent No.: US 12,141,022 B2
(45) Date of Patent: Nov. 12, 2024

(54) SEMICONDUCTOR CHIP AND SECURITY CIRCUIT ASSEMBLY CONTAINING REDUNDANT SAFETY CIRCUITRY FOR MONITORING BASE FUNCTIONS

(71) Applicant: Vitesco Technologies GmbH, Regensburg (DE)

(72) Inventors: Andreas Wunderlich, Munich (DE); Alfons Fisch, Munich (DE); Thierry Bavois, Munich (DE); Franz Laberer, Munich (DE)

(73) Assignee: Vitesco Technologies GmbH, Hannover (DE)

( * ) Notice: Subject to any disclaimer, the term of this patent is extended or adjusted under 35 U.S.C. 154(b) by 11 days.

(21) Appl. No.: 18/005,697

(22) PCT Filed: Jun. 21, 2021

(86) PCT No.: PCT/EP2021/066859
§ 371 (c)(1),
(2) Date: Jan. 17, 2023

(87) PCT Pub. No.: WO2022/012876
PCT Pub. Date: Jan. 20, 2022

(65) Prior Publication Data
US 2023/0305913 A1    Sep. 28, 2023

(30) Foreign Application Priority Data
Jul. 15, 2020   (DE) .................... 10 2020 208 854.3

(51) Int. Cl.
*G06F 11/07*     (2006.01)
*G05B 9/03*      (2006.01)
(Continued)

(52) U.S. Cl.
CPC ............ *G06F 11/0757* (2013.01); *G05B 9/03* (2013.01); *G05B 19/0428* (2013.01);
(Continued)

(58) Field of Classification Search
CPC ... G06F 11/0757; G06F 11/0736; G05B 9/03; G05B 19/0428; G05B 2219/24125; H03K 17/18
See application file for complete search history.

(56) References Cited

U.S. PATENT DOCUMENTS 4,581,701 A * 4/1986 Hess ................. G05B 9/03
                                                  714/10
5,372,410 A   12/1994 Miller et al.
(Continued)

FOREIGN PATENT DOCUMENTS

DE    102014209090 A1   11/2015
EP       2685378 A1     1/2014
(Continued)

*Primary Examiner* — Matthew M Kim
*Assistant Examiner* — Indranil Chowdhury
(74) *Attorney, Agent, or Firm* — Laurence A. Greenberg; Werner H. Stemer; Ralph E. Locher

(57) ABSTRACT

A semiconductor chip with functions implemented thereon in circuitry has a first region, in which a first group of safety-relevant base functions are implemented in circuitry, and a second region, which is separated from the first region using technological safety measures and in which a first group of monitoring functions that monitor the base functions are implemented in circuitry. It also contains a third region, which is formed on the semiconductor chip and is separated from the other regions using technological safety measures and in which a second group of monitoring functions that monitor the base functions are implemented in circuitry.

10 Claims, 1 Drawing Sheet

(51) Int. Cl.
*G05B 19/042* (2006.01)
*H03K 17/18* (2006.01)

(52) U.S. Cl.
CPC ......... *G06F 11/0736* (2013.01); *H03K 17/18* (2013.01); *G05B 2219/24125* (2013.01)

(56) References Cited

U.S. PATENT DOCUMENTS

| | | |
|---|---|---|
| 6,208,242 B1 | 3/2001 | Engelmann et al. |
| 6,438,462 B1 | 8/2002 | Hanf et al. |
| 10,585,772 B2 | 3/2020 | Katrak |
| 12,012,125 B2 * | 6/2024 | Krishnani ......... B60W 50/0205 |
| 2008/0258253 A1 * | 10/2008 | Fey .......................... G05B 9/03 |
| | | 257/500 |
| 2008/0312790 A1 | 12/2008 | Fey et al. |
| 2010/0254058 A1 * | 10/2010 | Kirchbaum ............. G06F 1/206 |
| | | 361/103 |
| 2011/0087460 A1 * | 4/2011 | Girardey ................. G05B 9/02 |
| | | 702/182 |
| 2015/0331040 A1 | 11/2015 | Bernon-Enjalbert et al. |
| 2016/0077909 A1 | 3/2016 | Furuya et al. |
| 2019/0079835 A1 | 3/2019 | You et al. |
| 2019/0235448 A1 | 8/2019 | Banginwar et al. |
| 2023/0305913 A1 * | 9/2023 | Wunderlich ........... H03K 17/18 |
| 2023/0347745 A1 * | 11/2023 | Kong ..................... B60W 10/08 |
| 2024/0175909 A1 * | 5/2024 | Rasbornig ............. G01R 31/006 |

FOREIGN PATENT DOCUMENTS

| | | | | |
|---|---|---|---|---|
| GB | 2360856 A | * | 10/2001 | ......... G05B 19/0428 |
| GB | 2601920 A | * | 6/2022 | ........... G05B 19/042 |
| WO | WO-2014006442 A1 | * | 1/2014 | ......... G01R 31/2851 |
| WO | 2015135803 A1 | | 9/2015 | |

* cited by examiner

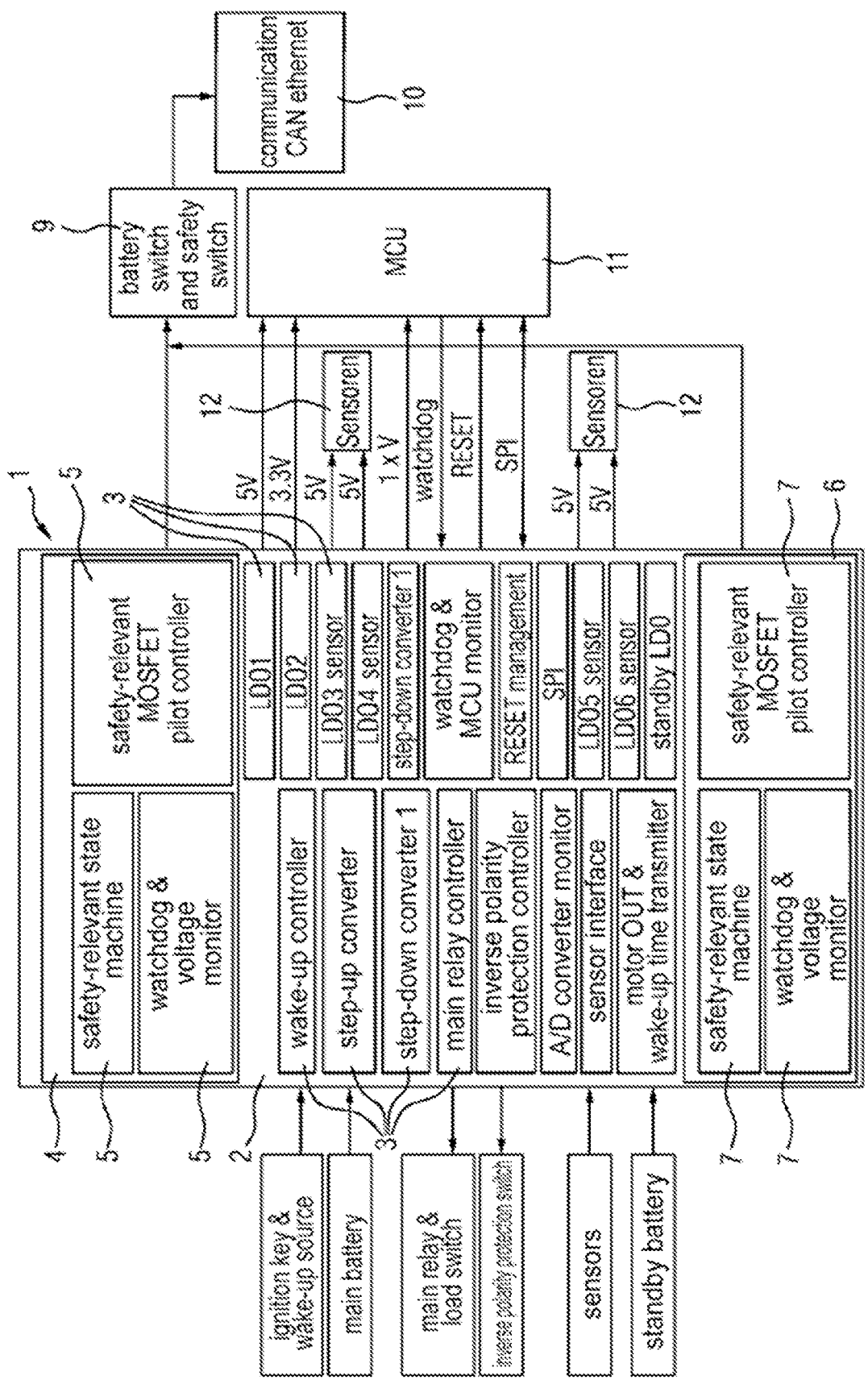

SEMICONDUCTOR CHIP AND SECURITY CIRCUIT ASSEMBLY CONTAINING REDUNDANT SAFETY CIRCUITRY FOR MONITORING BASE FUNCTIONS

FIELD AND BACKGROUND OF THE INVENTION

The invention relates to a semiconductor chip with functions implemented thereon in circuitry, having a first region, in which a first group of safety-relevant base functions are implemented in circuitry, and a second region, which is separated from the first region using technological safety measures and in which a first group of monitoring functions that monitor the base functions are implemented in circuitry. The invention also relates to a safety circuit arrangement having such a semiconductor chip and at least one safety switch connected thereto, which is connected to a switch or an actuator.

Such a semiconductor chip and such a safety circuit arrangement are already known from DE 10 2014 209 090 A1.

The teaching there includes using an integrated circuit on a circuit carrier or chip carrier as a safety center, in which a shut-off unit insulated from the control unit is formed on the circuit carrier or a self-contained shut-off unit in the form of a safety island is provided separately on the circuit carrier. In normal operation, the control unit is used to ensure the voltage supply to individual components of the circuit arrangement, e.g. microcontrollers. The shut-off unit is not also electronically connected to the control unit on the circuit carrier and has its own separate connector for connecting to the power supply device, e.g. a battery. Ideally, the connection to the power supply device is provided with reverse polarity protection. The shut-off unit can thus perform its function without restriction even in the event of a failure of the control unit and offers a redundant shut-off path to the control unit, which remains operable precisely in the aforementioned fault cases. In particular for power-assisted steering devices, the increased failure safety of the shut-off unit offers the advantage of intercepting unforeseen motor interventions in the steering.

The known shut-off unit ensures a controlled shut-off of the motor or a controlled separation of the motor from the supply voltage. In this way, damage to the electronic components connected to the motor can be prevented. On the other hand, it is possible to ensure that no unwanted motor torques are generated after the power supply has been properly shut off. The presence of the insulation and the separate connection to the power supply device ensures that the shut-off unit is also not adversely affected in the event of a fault in the power supply device, e.g. a battery, or in the connection to the power supply device. Alternatively, or in addition, the shut-off unit may also be provided with its own power supply device. The shut-off functions are combined in the shut-off unit in accordance with DE 10 2014 209 090 A1 and together with the control unit are reduced to a single circuit carrier or chip.

In general, it can be said that with the constantly increasing complexity of electronic components in vehicles, the possibility of malfunctions also increases. If a safety-relevant component is affected by such a malfunction, in the worst case, people can be harmed. If, for example, an electronic stability program (ESP) control unit in a motor vehicle unexpectedly triggers emergency braking when driving at speed, this could lead to a rear-end collision. In order to minimize the risk of dangerous malfunctions of safety-relevant electronic systems, these should be developed with due observance of relevant standards. One such standard is ISO 26262.

The start of a development process according to ISO 26262 can be described in the following steps (see Wikipedia):

1. The vehicle manufacturer who places a product on the market—that is, sells it to end users—examines the circumstances and situations in which the vehicle could harm or kill people.
2. Definition of safety goals that describe the unwanted behavior, e.g. "Avoid unintentional starting of the vehicle."
3. Determine and evaluate risk, e.g.
   1. non-hazardous (e.g. air conditioning control unit),
   2. minor hazards, such as quality management (QM), that can be achieved without special measures from the standard, or the
   3. classification of automotive safety integrity level (ASIL) A to ASIL D, for which the standard is to be applied.
4. Identify components (of the suppliers) that could contribute to, e.g. "Engine accelerates unintentionally" or "Automatic transmission leaves P or N by itself"
5. Inform component suppliers of the required function as a safety requirement, the ASIL and some other information, to include them in the safety-directed development.

In this context, the implementation of monitoring functions in a secured region of a semiconductor chip may also be unsafe if harmful external influences have an impact across all potential isolation and insulation measures.

SUMMARY OF THE INVENTION

The object of the invention is therefore to provide a remedy for this problem.

The object is achieved by a semiconductor chip with functions implemented thereon in circuitry, having a first region, in which a first group of safety-relevant base functions are implemented in circuitry, and a second region, which is separated from the first region using technological safety measures and in which a first group of monitoring functions that monitor the base functions are implemented in circuitry, and which has a third region which is formed on the semiconductor chip and is separated from the other regions using technological safety measures and in which a second group of monitoring functions that monitor the base functions are implemented in circuitry.

This allows a significantly higher level of safety to be achieved, as there is only a very low probability that a safety-related error will affect both groups of monitoring functions, which are formed in different regions of the semiconductor chip separated by technological safety measures. This means that safety can be guaranteed in all conceivable situations within the scope of ISO 26262, ASIL D specifications.

In one embodiment of the invention, the first group of safety-relevant base functions comprises a number of voltage regulators for outputting supply voltages.

The supply voltages, which are usually generated and regulated from a battery voltage, are used to supply other external circuits such as microprocessors or microcontrollers, sensors, communication modules, etc. If faults cause the supply voltages not to be generated correctly, this can affect the correct functioning of these supplied circuits and be transferred from these to other functions. For example, a microprocessor operating incorrectly due to an excessively low supply voltage could generate incorrect control signals for actuators, which can lead to problematic malfunctions. Such a malfunction must therefore be detected in good time and the monitoring functions must activate safety switches, for example, which can prevent the transmission of incorrect signals. However, if the fault also affects the safety functions, this safety monitoring can fail. The measure according to the invention is designed to prevent this.

The first and the second group of monitoring functions in embodiments of a semiconductor chip according to the invention can each have a fail-safe pre-driver and/or a fail-safe machine and/or a watchdog circuit and/or a voltage monitoring circuit. However, other practical monitoring circuits or monitoring functions are also possible.

The safety measures on a semiconductor chip according to the invention can comprise a separation of the energy supply or the layout and/or an electrical insulation and/or voltage robustness and/or a decoupling of a redundant shut-off path. Measures such as those already described in DE 10 2014 209 090 A1 can also be taken.

The invention also relates to a safety circuit arrangement having a semiconductor chip according to any one of the semiconductor chip claims and at least one safety switch connected thereto, which is connected to a switch or an actuator. The safety circuit arrangement is configured to activate or deactivate the switch or the actuator by means of the at least one safety switch, the safety switch being connected to both groups of monitoring functions.

The safety switch is used to perform or to prevent an action and can be induced by both groups of monitoring functions to perform its function.

BRIEF DESCRIPTION OF THE FIGURE

The single figure of the drawing is an illustration of a safety circuit configuration having a semiconductor chip according to the invention.

DETAILED DESCRIPTION OF THE INVENTION

The figure of the drawing shows a semiconductor chip 1 having a first region 2, in which a first group 3 of safety-relevant base functions is implemented in circuitry. These base functions in the illustrated exemplary embodiment are in particular linear regulators LDO1 to LDO6, which are used to generate different supply voltages in the range of, for example, 3 volts to 5 volts, in particular from a vehicle battery voltage (main battery). These supply voltages can be used in the illustrated example of FIG. 1 to supply a microprocessor 11 or sensors 12. The safety-relevant base functions can include additional functions such as a sensor interface or an SP1 interface.

In particular, a microprocessor 11 requires a stable supply voltage in order to work properly. It is true that the function of a microprocessor 11 is usually monitored via a watchdog function, which in the illustrated exemplary embodiment is also realized on the semiconductor chip 1 in a second region 4 in a first group 5 of monitoring functions. However, it can still happen that the faulty function of the microprocessor is detected, but the output of the incorrect control signals can nevertheless no longer be prevented. For this purpose, safety switches 9 are provided, which can either prevent the forwarding of these control signals or can deactivate the receiver modules, such as a communication module 10.

The second region 4 is also implemented on the semiconductor chip 1, however, it is protected by means of safety measures such as a separation of the energy supply or the layout, and/or an electrical insulation and/or voltage robustness and/or a decoupling of a redundant shut-off path. The essential aim of this is to prevent faults that occur in the circuits of the first region 2 from having a direct effect in the second region 4.

However, it can still happen that an error that affects one of the linear regulators LDO1 to LDO6 also persists through to the second region 4 and negatively affects the local monitoring functions of the first group of monitoring functions 5 or at least parts thereof, so that the safety switch 9 can no longer be actuated in a timely manner.

Therefore, according to the invention a third region 6 is provided on the semiconductor chip 1, which is also separated from the other two regions 3, 4 by suitable safety measures and in which a second group of monitoring functions 7 is implemented in circuitry. The monitoring functions of the second group of monitoring functions 7 can perform the same function or task as the monitoring functions of the first group of monitoring functions 5; the redundant design is only intended to significantly reduce the probability that an error in the first region 2 within the first group of safety-relevant base functions 3 will affect the monitoring functions.

For this purpose, the circuits of the second group of monitoring functions 7 are also connected to the corresponding safety switches 9, so that in the event of a failure of one of the two groups of monitoring functions 5, 7 there is a high probability that at least the other group will remain functional and able to activate the safety switches 9, in order, for example, to prevent communication devices 10 from forwarding incorrect control signals of a defective microprocessor 11.

The integration according to the invention of two groups of monitoring functions on only one semiconductor chip 1 achieves a high level of safety with only a low space requirement and thus also meets the requirements of bis ASIL D of ISO 262.

The invention claimed is:

1. A semiconductor chip with functions that are implemented thereon in circuitry, the semiconductor chip comprising:
   a first region in which a first group of safety-relevant base functions are implemented in circuitry;
   a second region being separated from said first region using technological safety measures and in which a first group of monitoring functions that monitor the safety-relevant base functions are implemented in circuitry; and
   a third region, formed on the semiconductor chip and is separated from said first and second regions using the technological safety measures and in which a second group of monitoring functions that monitor the safety-relevant base functions are implemented in circuitry, said first group of monitoring functions and said second group of monitoring functions both monitor a same said safety-relevant base functions thus being redundant monitoring systems of each other.

2. The semiconductor chip according to claim 1, wherein said first group of safety-relevant base functions contain a number of voltage regulators.

3. The semiconductor chip according to claim 1, wherein said first and the second groups of monitoring functions each have a fail-safe pre-driver and/or a fail-safe machine and/or a watchdog circuit and/or a voltage monitoring circuit.

4. The semiconductor chip according to claim 3, wherein said watchdog circuit performs watchdog and voltage monitoring functions.

5. The semiconductor chip according to claim 1, wherein the technological safety measures include a separation of an energy supply or a layout and/or an electrical insulation and/or voltage robustness and/or a decoupling of a redundant shut-off path.

6. A safety circuit configuration, comprising:
a semiconductor chip, containing:
   a first region in which a first group of safety-relevant base functions are implemented in circuitry;
   a second region being separated from said first region using technological safety measures and in which a first group of monitoring functions that monitor the safety-relevant base functions being implemented in circuitry; and
   a third region, formed on said semiconductor chip and being separated from said first and second regions using the technological safety measures and in which a second group of monitoring functions that monitor the safety-relevant base functions are implemented in circuitry;
at least one safety switch connected to said semiconductor chip; and
an apparatus, selected from the group consisting of a switch and an actuator, connected to said at least one safety switch, wherein the safety circuit configuration is configured to activate or deactivate said apparatus by means of said at least one safety switch, said at least one safety switch being connected to both said first and second groups of monitoring functions and receiving inputs from both said first and second groups of monitoring functions.

7. The safety circuit configuration according to claim 6, wherein said first group of safety-relevant base functions contain a number of voltage regulators.

8. The safety circuit configuration according to claim 6, wherein said first and said second groups of monitoring functions each have a fail-safe pre-driver and/or a fail-safe machine and/or a watchdog circuit and/or a voltage monitoring circuit.

9. The safety circuit configuration according to claim 8, wherein said watchdog circuit performs watchdog and voltage monitoring functions.

10. The safety circuit configuration according to claim 6, wherein said technological safety measures include a separation of an energy supply or a layout and/or an electrical insulation and/or voltage robustness and/or a decoupling of a redundant shut-off path.

* * * * *